United States Patent
Lee et al.

(10) Patent No.: US 7,989,079 B2
(45) Date of Patent: Aug. 2, 2011

(54) INSERT-MOLDED COVER AND METHOD FOR MANUFACTURING SAME

(75) Inventors: Han-Ming Lee, Taipei Hsien (TW); Chih-Chien Hung, Taipei Hsien (TW); Hsiang-Sheng Chou, Taipei Hsien (TW); Ching-Hsien Chang, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 432 days.

(21) Appl. No.: 12/187,397

(22) Filed: Aug. 7, 2008

(65) Prior Publication Data

US 2009/0280340 A1    Nov. 12, 2009

(30) Foreign Application Priority Data

May 9, 2008   (CN) .......................... 2008 1 0301531

(51) Int. Cl.
*B32B 15/04*    (2006.01)
(52) U.S. Cl. ..................... 428/469; 428/500; 428/312.8; 428/632; 428/701; 428/702
(58) Field of Classification Search ......................... None
See application file for complete search history.

(56) References Cited

U.S. PATENT DOCUMENTS

2006/0257624 A1*  11/2006  Naritomi et al. .............. 428/141
* cited by examiner

*Primary Examiner* — Ling Xu
(74) *Attorney, Agent, or Firm* — Zhigang Ma

(57) ABSTRACT

An exemplary insert-molded cover (10) for electronic devices includes a metallic body (11), a plastic antenna lid (12) integrally formed with the metallic body and an oxide film (12) formed on a surface (111) of the metallic body for attaching the plastic antenna lid. The present invention also relates a method for manufacturing the insert-molded cover for electronic devices.

7 Claims, 2 Drawing Sheets

INSERT-MOLDED COVER AND METHOD FOR MANUFACTURING SAME

CROSS-REFERENCE TO RELATED APPLICATIONS

This application is related to five co-pending U.S. patent applications, application Ser. No. 12/171,271, Ser. No. 12/187,395, Ser. No. 12/187,396, Ser. No. 12/187,394, and all entitled "INSERT-MOLDED COVER AND METHOD FOR MANUFACTURING SAME"; and application Ser. No. 12/187,393, entitled "JOINING STRUCTURE AND INSERT-MOLDED COVER USING SAME". In the co-pending applications, the inventors are Han-Ming Lee, Chih-Chien Hung, Hsiang-Sheng Chou and Ching-Hsien Chang. Such applications have the same assignee as the present application and have been concurrently filed herewith. The disclosures of the above identified applications are incorporated herein by reference.

BACKGROUND OF THE INVENTION

1. Field of the Invention

The present invention relates to insert-molded covers and, more particularly, to an insert-molded cover used for an electronic device and a method for manufacturing the insert-molded cover.

2. Discussion of the Related Art

Electronic devices, such as notebook computers, mobile phones, or personal digital assistants (PDAs), are very popular and widely used. Covers of electronic devices are generally made of two kinds of materials, plastic and metal. Generally, a metallic cover has a nicer appearance and a better surface feeling than a plastic one, thus metallic covers for electronic devices are now becoming more and more popular.

Because the metal has a good electromagnetic shielding capability, a portion of the cover corresponding to an antenna of an electronic device is made of plastic, so that signals can be received and transmitted through the plastic portion, and certain functions would not be weaken by electromagnetic shielding. Generally, the metallic cover includes a metallic body and a plastic antenna lid fixed to the metallic body by hook locking or rivet jointing. However, these fixing means easily leave a gap between the plastic antenna lid and the metallic body, such that the plastic antenna lid easily becomes loosened from the metallic body due to the gap. In addition, a thin metallic cover is susceptible to crack at the junction where the plastic antenna lid is fixed to the metallic body by hook locking or rivet jointing. Therefore, the mechanical strength and durability of the metallic cover is relatively compromised.

What is needed, therefore, is a new insert-molded cover that overcomes the above mentioned disadvantages.

SUMMARY

In one aspect, an insert-molded cover for electronic devices includes a metallic body, a plastic antenna lid integrally formed with the metallic body, and an oxide film formed on a surface of the metallic body for attaching the plastic antenna lid.

In another aspect, a method for manufacturing an insert-molded cover for electronic devices includes following steps. Firstly, a metallic body is manufactured. Secondly, the metallic body is processed by a chemical method and an oxide film is formed on a surface of the metallic body. Thirdly, a plastic antenna lid is molded on the metallic body by insert molding so that the plastic antenna lid is attached on the oxide film.

Other advantages and novel features will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of the present insert-molded cover. Moreover, in the drawings, like reference numerals designate corresponding parts throughout the several views.

DETAILED DESCRIPTION OF THE EMBODIMENTS

Reference will now be made to the drawings to describe preferred embodiments of the present insert-molded cover, in detail. The insert-molded cover is used for electronic devices such as notebook computers, and mobile phones.

Figure 1:
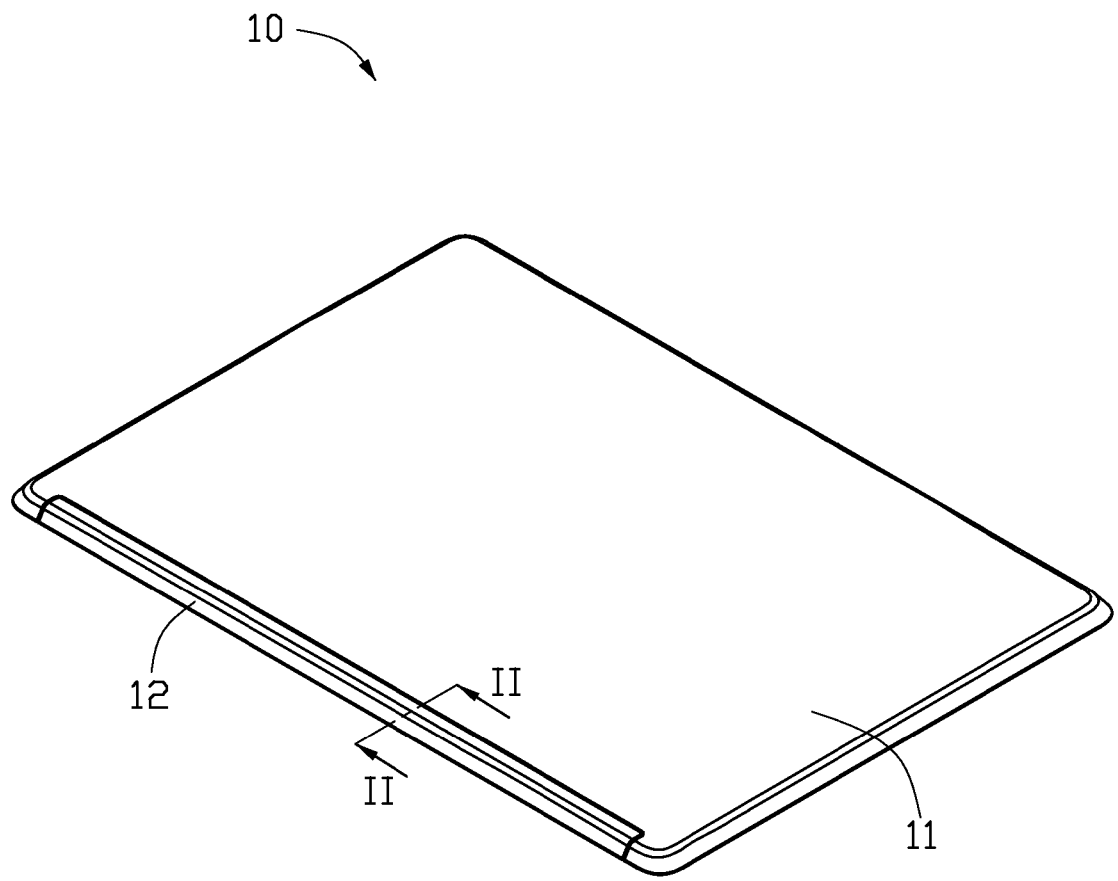
FIG. 1 is an isometric view of an insert-molded cover of the present invention in accordance with one preferred embodiment.
Figure 2:
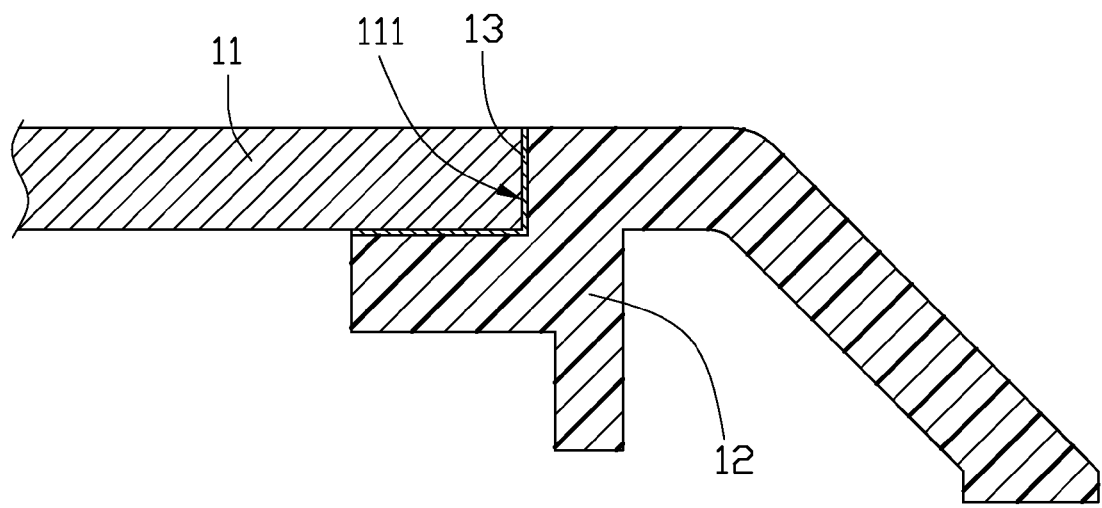
FIG. 2 is a partially, side cross-sectional view of the insert-molded cover, take along the line II-II in FIG. 1.

Referring to FIGS. 1 and 2, an insert-molded cover 10 for electronic devices according to a preferred embodiment is shown. The insert-molded cover 10 includes a metallic body 11, a plastic antenna lid 12, and an oxide film 13 formed on a surface 111 of the metallic body 11 for attaching the plastic antenna lid 12.

The metallic body 11 is substantially a rectangular plate made of alloy, and the alloy is preferably magnesium alloy, aluminum alloy or titanium alloy. In this preferred embodiment, the metallic body 11 is made of magnesium alloy.

The plastic antenna lid 12 is substantially an elongated sheet. The plastic antenna lid 12 is integrally formed on an edge of the metallic body 11. Material of the plastic antenna lid 12 should have a good bonding ability with material of the metallic body 11. In other words, the material of the plastic antenna lid 12 should have a low shrinkage and a similar linear expansion with the material of the metallic body 11. Thus, the material of the plastic antenna lid 12 is selected from the group consisting of liquid crystal polymer (LCP), polyphenylene sulphide (PPS), polybutylene terephthalate (PBT) and their combination.

The oxide film 13 is formed by a chemical method, such as micro-arc oxidation method, anode oxidation method or phosphating conversion method. In this preferred embodiment, the oxide film 13 is formed by micro-arc oxidation method. The thickness of the oxide film 13 is preferably in a range from about 1 micron to about 5 microns. A surface of the oxide film 13 is coarse and has irregular porous structures for attaching the plastic antenna lid 12 in molding process. Thus, the plastic antenna lid 12 and the metallic body 11 are firmly bonded together via the oxide film 13.

A method for manufacturing the insert-molded cover 10 includes following steps.

Firstly, a metallic body 11 is manufactured by casting, forging, or extrusion molding methods.

Secondly, the metallic body 11 is processed by a chemical method, such as micro-arc oxidation, anode oxidation or phosphating conversion methods. Thus, an oxide film 13 is formed on a surface 111 of the metallic body 11. Preferably, the oxide film 13 is formed by the micro-arc oxidation method. The preferred technological condition of the micro-arc oxidation method is as follows: an electric current density is in the range from 100 A/m² to 150 A/m², a temperature is in a range from 20° C. to 40° C., an electric frequency is in the range from 500 HZ to 800 HZ, and a duty cycle is in the range from 12% to 20%.

Thirdly, a plastic antenna lid 12 is molded on the metallic body 11 by insert molding so that the plastic antenna lid 12 is attached on the oxide film 13. In detail, the metallic body 11 is placed into an injection mold as an insert member, then melted plastic is injected into the injection mold. The oxide film 13 is covered by the melted plastic, the surface of the oxide film 13 is coarse and has irregular porous structures filled with the melted plastic. After the melted plastic is cooled, the plastic antenna lid 12 is firmly attached on the oxide film 13. Thus, the bonding strength of the metallic body 11 and the plastic antenna lid 12 is enhanced via the oxide film 13.

It should be pointed out that, after the first step, the metallic body 11 can be cleaned to remove ashes, oxides or greasy dirt, thus allowing the oxide film 13 to more easier form on the surface of the metallic body 11.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An insert-molded cover, used for electronic devices, the insert-molded cover comprising:

a metallic body having a bottom surface and a side surface substantially connected to the bottom surface;

a plastic antenna lid integrally formed with the metallic body; and an oxide film formed on a part of the bottom surface and the side surface of the metallic body for attaching the plastic antenna lid.

2. The insert-molded cover as claimed in claim 1, wherein the metallic body is a rectangular plate made of a material selected from the group consisting of magnesium alloy, aluminum alloy and titanium alloy.

3. The insert-molded cover as claimed in claim 1, wherein the plastic antenna lid is an elongated sheet, and the plastic antenna lid is formed on an edge of the metallic body.

4. The insert-molded cover as claimed in claim 3, wherein the material of the plastic antenna lid is selected from the group consisting of liquid crystal polymer, polyphenylene sulphide or polybutylene terephthalate and their combination.

5. The insert-molded cover as claimed in claim 1, wherein the oxide film is formed by a method of micro-arc oxidation.

6. The insert-molded cover as claimed in claim 1, wherein the thickness of the oxide film is in a range from about 1 micron to about 5 microns.

7. The insert-molded cover as claimed in claim 1, wherein a surface of the oxide film is coarse and includes irregular porous structures for attaching the plastic antenna lid in a molding process.

* * * * *